Figure 1:
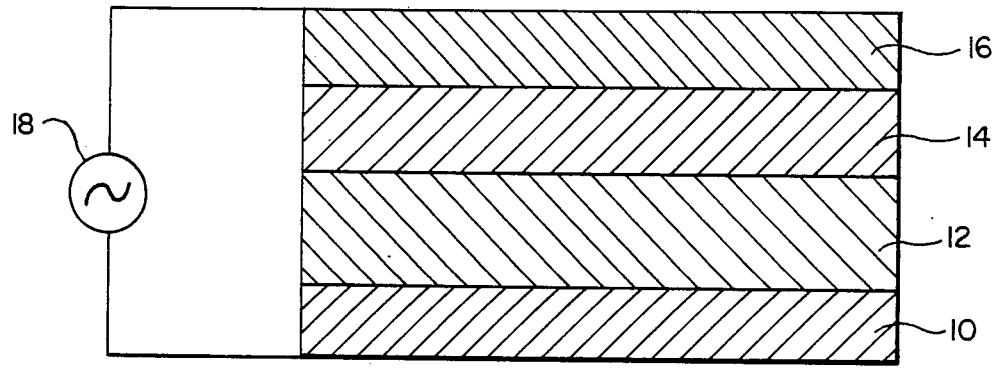

United States Patent [19]

Anderson, Sr.

[11] Patent Number: 4,849,672
[45] Date of Patent: Jul. 18, 1989

[54] METHOD OF PRODUCING ELECTROLUMINESCENCE AT A P-N JUNCTION AND ELECTROLUMINESCING LAMP

[75] Inventor: Scott Anderson, Sr., Champaign, Ill.

[73] Assignee: Advanced Lighting International, Oakwood Village, Ohio

[21] Appl. No.: 865,400

[22] Filed: May 21, 1986

[51] Int. Cl.⁴ .......................................... H05B 33/14
[52] U.S. Cl. .................................... 313/499; 313/501
[58] Field of Search ............... 313/498, 499, 501, 506; 357/17; 29/569 L, 576 R; 427/66

[56] References Cited

U.S. PATENT DOCUMENTS 3,330,983  7/1967  Cusano et al. ................. 313/499
3,404,305 10/1968  Wright ........................... 313/499

Primary Examiner—Leo H. Boudreau
Assistant Examiner—K. Wieder
Attorney, Agent, or Firm—Rogers & Killeen

[57] ABSTRACT

A method of producing electroluminescence without a chemical reaction by the decay of the energy level of electrons from an excited state which results from collision of accelerated free electrons with ions in the oxide, the free electrons being accelerated by space charges within the oxide of adjacent to the boundary thereof as a result of a P-N junction. Electroluminescing lamps are also disclosed.

24 Claims, 1 Drawing Sheet

METHOD OF PRODUCING ELECTROLUMINESCENCE AT A P-N JUNCTION AND ELECTROLUMINESCING LAMP

BACKGROUND OF THE INVENTION

The present invention is directed to a method and apparatus for producing electroluminescence without a chemical reaction It has long been known that certain metals such as aluminum (Al), magnesium (Mg), tantalum (Ta), titanium (Ti), thallium (Tl), tungsten (W), zirconium (Zr), and zinc (Zn) will emit light when anodized in certain aqueous electrolytes, such as citric acid, oxalic acid, ammonium oxalate, phosphoric acid, dilute sulfuric acid, etc. In all known instances, the significant characteristic of the electrolyte has been that it permits the formation of an oxide coating upon the metal used as the anode in the anodizing process.

The oxides of these metals are "excess" or "N-type" semiconductors. For a given alloy, the luminous intensity per watt may vary as a function of the electrolyte. For a given electrolyte, the luminous intensity per watt may vary with the impurity and its concentration in the alloy. The color of the luminescence is known to be a function of the alloy of the particular metal and independent of the electrolyte, i.e., a function of the energy given up by an excited electron as it assumes a stable state.

It is also generally known that luminescence is a property of the oxide and involves energy levels of 2.2–3.0 electron volts, as a function of the nature of the impurities in the metal. The rectifying properties of the electrolyte/semi-conductor/metal combinations result from the accumulation of space charges within the oxide and vary as a function of the type of semi-conductor and the direction of current flow. This accumulation of space charges gives rise to high electric fields within the oxides. It has been shown by Anderson (J. Appl. Physics Vol. 14, No. 601 (1943)), that the space charges within the oxide may be shifted with alternating potentials, in which event the cathodic flash augments the intensity of the anodization luminescence at certain frequencies of the alternating current.

Notwithstanding the knowledge that electroluminescence can be produced uniformly over the area of the metal during the growth of certain oxides in the presence of an aqueous solution as described above, efforts to produce an analogous electroluminescence in the absence of a chemical reaction and/or a solid state electroluminescing lamp have not succeeded. Hickmott (J. Appl. Phys., Vol. 36, No. 6, June 1965) showed electroluminescence of metal oxides in the absence of a chemical reaction, but such luminescence is non-uniform over the area of the metal oxide and exists only after breakdown of the dielectric.

The production of electroluminescence by a chemical reaction is unacceptable for applications such as lamps. In addition to the problems inherent in the handling of acids, any such reaction inevitably exhausts the reactants, may create problems in the handling of the undesired by-products of the reaction, etc.

Attempts to produce electroluminescence in the dry state are reported by Wesolowski et al., (Acta Physica Polonica, Vol. XX, No. 4 (1961)) where pure aluminum was anodized in oxalic acid by a constant current (2–5 ma/cm$^2$) and by a constant voltage (24–240 volts d.c.), where the oxide surface thereof was coated with a transparent N-type semi-conductor (cadmium oxide CdO by cathodic reactive sputtering; and tin oxide SnO$_2$ by chemical deposition), and where luminescence was observed upon the application of a strong electric field between the positive and negative semi-conductor electrodes. However, as cautioned therein, and as explained in Wesolowski (Acta Physica Polonica, Vol. XXIV, No. 3(9) (1963)), the electroluminescence of such metal/oxide/semi-conductor structures is dependent on the presence of liquid water (and thus a chemical reaction) as in the well known process by which aluminum is anodized in a liquid electrolyte.

It is known to produce electroluminescence in the dry state with "thick film" zinc sulfide panels. Such panels generally include a layer of copper coated phosphor grains "formed" by the passage of a d.c. current therethrough. When subjected to an electric field, certain spots on the phosphor grains luminesce. While heretofore not understood, this electroluminescence is believed to be the result of space charges at the junction of CuS (a P-type semi-conductor) on the surface of the ZnS grains (a N-Type semi-conductor).

It is also known to produce electroluminescence in the dry state with manganese doped "thin film" zinc sulfide sandwiched between dielectric layers to limit the current therethrough. Such thin film elements are disclosed, e.g., in the Takeda, et al., U.S. Pat. No. 4,394,601 dated July 19, 1983, and the Marrello, et al., U.S. Pat. No. 4,275,336 dated June 23, 1981.

Luminescence in the dry state is also disclosed in the Burmeis, Jr., et al., U.S. Pat. No. 3,406,869 dated Apr. 14, 1970 at the junction of P-type and N-type boron subphosphide B,P.

To the knowledge of applicant, electroluminescence has not previously been produced by an adherent P-type semi-conductor coating on an electrolytically grown oxide.

It is accordingly an object of the present invention to provide a novel method of electroluminescence in metal oxides by the acceleration of electrons from space charges associated with a P-N junction.

It is a further object of the present invention to provide a novel method of producing electroluminescence without any chemical reaction.

It is another object of the present invention to provide a novel method of producing electroluminescence without the decomposition of water.

It is a still a further object of the present invention to provide a novel method of producing electroluminescence in the absence of a carboxylic acid.

It is yet another object of the present invention to provide a novel solid state electroluminescing lamp.

It is still a further object of the present invention to provide a novel electroluminescing lamp using a doped metal oxide.

Yet still a further object of the present invention is to provide a novel electroluminescing lamp using an electrolytically produced metal oxide adherent to a metal substrate.

An additional object of the present invention is to provide a novel electroluminescing lamp operable at low current and power levels, with increased efficiency.

These and many other objects and advantages of the present invention will be apparent from the claims and from the following description when read in conjunction with the appended drawings.

THE DRAWINGS

Figure 2:
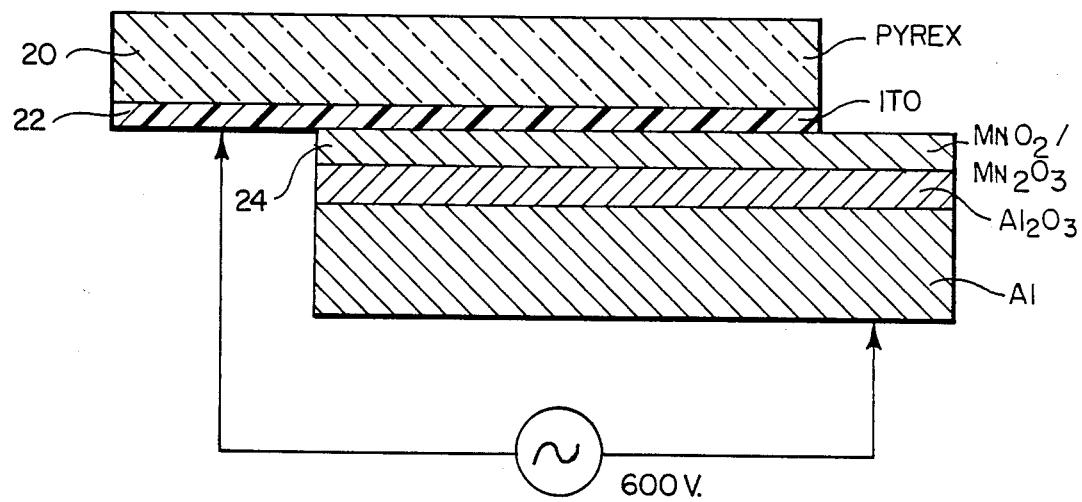

FIG. 1 is a section in elevation of one embodiment of the lamp of the present invention; and FIG. 2 is a section in elevation of a second embodiment of the lamp in accordance with the present invention using manganese dioxide as a current barrier of low conductivity.

THE DETAILED DESCRIPTION OF PREFERRED EMBODIMENTS

The methods of the present invention produce electroluminescence without a chemical reaction through P-N junction or space charge excitation In one embodiment, a metal oxide containing electron traps within the oxide is provided and high energy (i.e., conduction band) free electrons are trapped in the electron traps of the metal oxide to release energy in the form of light.

The metal oxide is of the "excess" or "N-type" semiconductor, electrolytically grown and adherent to the metal in its production.

The electron "traps" may include electron holes where an electron has been removed from the valence band (e.g., copper oxide with an excess of oxygen) as well as traps produced by distortion of the lattice of the oxide (e.g., by the inclusion of impurities in the metal oxide or the surface state of the metal oxide).

The trapped electron must have attained an energy level in the conduction band in order to release energy in the form of a photon when trapped. It may acquire that energy as a result of acceleration by the space charges within, and adjacent to, the oxide boundary.

Electroluminescence may also be produced without the trapping of free electrons. For example, the electrons in the valence bands of the metal ions of the oxide, upon collision with an accelerated free electron, may acquire an excited state without being removed from the vicinity of the "parent" ion, i.e., it may by excited from the valence band to a level in the band gap. Such electrons will not long remain in this excited state and give up the excess energy as photons in resuming their normal state in the valence band The color of such luminescence will be characteristic of the excited ion, normally an impurity.

The accelerated electrons which bombard the oxide may by such collision excite a bombarded electron to a conduction band energy level and be displaced from the "parent" ion, thereby creating a hole which in turn may trap a second conduction band energy electron and cause the emission of that energy as a photon. These two mechanisms may occur simultaneously in any electron bombardment.

Electrons for bombardment may be accelerated in the oxide or at the interface of the oxide as a result of the high field gradients or space charges where the interface is a P-N junction.

The metal oxide is adherent to the metal in the production process, i.e., electrolytically grown oxides have proven satisfactory while oxides produced by other chemical reaction have not. In all cases the resultant oxide must be an "excess" or "N-type" semi-conductor.

The metal may be pure or may be doped with impurities as in the case of alloys. For example, the light emitted from pure aluminum is blue-white in color and that emitted from an aluminum/manganese alloy is primarily yellow in color. Thus color of the light is a function of both the alloy and its concentrations, and may produce a spread of colors. Selected rare earth metals may be added for this purpose.

The resulting oxide must be porous rather than a single crystal. Based on experiments to date, porous unsealed oxides grown in 0.5% oxalic acid are expected to produce oxide films having higher resistance and greater and more uniform luminescence than films produced by non-porous oxides such as $Al_2O_3$ grown in boric acid. An exception to this rule appears to be alumina trihydrate which forms when the porous oxalic acid grown oxide layers are soaked in boiling water.

The depth of the oxide layer is believed to be critically important. However, the oxide layer thickness must exceed about 100 Å in thickness to prevent the electrons from crossing the layer by quantum mechanical tunnelling, a radiationless transition. It is expected that the layer will have to approach 500 Å in thickness to develop the necessary space charge and to provide sufficient numbers of manganese ions for appreciable light. The surface of the oxide layer is oxygen enriched while the layer adjacent the metal is enriched with the metal ions. The oxygen enriched layer remains fairly constant in depth as the oxide is formed into the metal, and it is thought that it is the outer layer which provides most of the luminescence.

By way of example only, oxides have been produced as follows:

Example No. 1: A metal oxide was produced by anodizing No. 3003 aluminum alloy in a 0.5% oxalic acid solution for 60 minutes at a current of 6 ma/cm$^2$ at 30 volts and a temperature of approximately 50° C. The resulting oxide was about 6,000 Å in thickness. Since the oxide was intended to serve as the dielectric of a condenser, a substantially impervious film was desired to contain a high electric field within the oxide. Accordingly, the oxide was thereafter sealed by soaking in boiling water for one hour. As a result of this exposure to the hot water, the surface of the oxide was sealed by the formation of aluminum trihydrate.

Example No. 2: An oxide was provided from No. 3003 aluminum alloy, by anodization for 120 minutes in a 3.2% boric acid with a direct current which varied from 60 ma/cm$^2$ to 1 ma./cm$^2$, at a voltage which varied from 20 to 400 volts and a temperature between 21° C. and 60° C. The resulting oxide was estimated to be approximately 4000 Å thick as it is well established that pure Al develops an oxide layer thickness equal to approximately 12.7 Å/volt (about 12.5–13.2 Å/volt) The resulting oxide had a resistance of about 3 ohms in the dry state.

Example No. 3: A panel of No. 3003 aluminum alloy was anodized for 4 hours at six ma/cm$^2$ in 0.5% oxalic acid with a voltage varying between 40 and 100 volts. The resultant oxide was approximately 5,000 Å thick with resistance greater than 20 megohms after drying.

Example No. 4: An oxide was produced by anodization of No. 3003 aluminum alloy for 60 minutes in 0.5% oxalic acid at 6 ma/cm$^2$ and a voltage between 20 and 40 volts. The resulting oxide film had a thickness of approximately 5,000 Å and a resistance of 1.7 megohms.

Example No. 5: A panel of No. 3004 aluminum alloy was anodized in a 0.5% oxalic acid for 4 hours at 6 ma/cm$^2$ and 50–120 volts. The resulting oxide had a thickness of approximately 6,000 Å and a resistance greater than twenty megohms.

Conduction band energy level free electrons may be provided at the P-N semi-conductor junction and space charge accelerated. To this end, a P-type semi-conductor is applied to the oxide.

As is well known, the energy above that required to maintain an electron in its position in the lattice of the oxide is emitted in the form of light when an electron is trapped. Such traps may include holes resulting from impurities in the oxide, surface effects and any other distortion of the lattice.

In addition, electrons associated with the metal ions in the oxide lattice may be temporarily excited and emit photons when resuming a normal energy level. For example, the electrons associated with the metal ions in the oxide lattice may be excited upon collision with the accelerated electrons to an energy level insufficient to enter the conduction band but sufficient to emit a photon upon relaxation to its stable state.

Oxides grown in boric acid develop a voltage approximately ten times greater than oxalic acid grown oxides during anodization because the boric oxide does not dissolve the oxide, and thus it is believed to produce a P-N junction at the oxide/electrolyte interface. In one embodiment, an adherent P-type semi-conductor such as $Cu_2O$ is deposited e.g., by electroplating, or vacuum evaporation, on an electrolytically grown oxide (a N-type semi-conductor) to provide a P-N junction in the dry state.

SOLID STATE LAMPS

The solid state electroluminescing lamp of the present invention may take the form illustrated in FIG. 1. With reference to FIG. 1, a flat plate of metal (10) may serve as one electrode of the lamp with a N-type semi-conductor oxide layer 12 grown therein on one flat surface. A suitable P-type semi-conductor 14 such as $Cu_2O$ is adhered thereto. Thereafter a semi-transparent electrode 16 laser may be provided as the second electrode, and both electrodes connected to a suitable alternating current source of electrical power (18).

A dry electrolytic lamp was made by preparing a panel as set out in Example No. 5 above. The panel was then immersed in a 25% manganese nitrate solution for 30 seconds. The panel was removed from the solution and, while dripping wet, placed on a hot plate at 248°–260° C. for four minutes. Thereafter the excess rough surface manganese dioxide was polished off with 600 grit carborundum paper, and the panel was rinsed in dilute sodium hydroxide, rinsed in distilled water and dried.

This panel was made into a "sandwich" as shown in FIG. 2 by clamping a piece of glass 20, preferably IRR glass with a conducting indium-tin oxide film 22 on its surface to the manganese dioxide surface 24. Upon the application of a 60 hertz, a.c. potential at 600 volts, a continuous yellow glow was observed over much of the panel surface with an unknown current. The glow had particular brightness in the region where the panel and the conductive glass were most tightly pressed together.

The mechanism is not fully understood but is believed to be the result of the P-N junction formed by (a) the aluminum oxide $Al_2O_3$ and manganese dioxide MnO semi-conductor) and (b) the oxygen enriched manganese oxide $Mn_2O_3$ (P-type semi-conductor) formed in the pyrolizing process on the surface of the $MnO_2$ layer. In a specific example, the $Al_2O_3$ is 3,000–5,000 Å and the $Mn_2O_3$ is 500–1,000 Å, and the applied electrical potential may be direct as well as alternating.

The foregoing examples are to be considered illustrative only and many modifications thereof may occur to those skilled in this art without departing from the spirit of the invention as defined by the following claims when accorded a full range of equivalents.

What is claimed is:

1. The method of producing electroluminescence by the steps of:
   (a) providing at least one layer of a metal oxide N-type semi-conductor
   (b) adhering a layer of a p-type semi-conductor to the layer of a metal oxide N-type semi-conductor to thereby form a P-N junction, wherein at least one of (a) said N-type semi-conductor and (b) said P-type semi-conductor includes an oxide of manganese; and
   (c) subjecting the P-N type junction to an electrical potential to thereby accelerate free electrons adjacent the P-N junction into collision with metal ions of the metal oxide and excite electrons of the metal ions sufficiently to cause the emission of photons upon relaxation of such electrons to a valence band energy level.

2. The method of claim 1 wherein the metal oxide is porous.

3. The method of claim 1 wherein the metal oxide is electrolytically grown in boric acid.

4. The method of claim 1 wherein the metal oxide is electrolytically grown in oxalic acid.

5. The method of claim 1 wherein the metal of the metal oxide N-type semi-conductor layer is selected from the group comprising aluminum, manganese, tantalum, titanium, thallium, tungsten, zirconium and zinc.

6. The method of claim 5 wherein the metal of the metal oxide is aluminum.

7. The method of claim 5 wherein the metal of the metal oxide is tantalum.

8. The method of claim 5 wherein the metal of the metal oxide is an alloy.

9. The method of claim 1 wherein the electrons of the metal ions are not displaced from the metal ion by the collision.

10. The method of claim 1 wherein the electrons of the metal ions are displaced from the metal ion by the collision to thereby create a hole.

11. An electroluminescing lamp comprising:
    (a) at least one metal adherent N-type semi-conductor metal oxide layer;
    (b) a semi-transparent P-type semi-conductor layer adherent to said metal oxide layer wherein at least one of (a) said N-type semi-conductor and (b) said P-type semi-conductor includes an oxide of manganese; and
    (c) means for applying an electric potential to said semi-conductor layers.

12. The lamp of claim 11 wherein said electric potential is a.c.

13. The lamp of claim 11 wherein said electric potential is d.c.

14. An electroluminescing lamp comprising:
    (a) a metal layer;
    (b) at least one of a first metal oxide layer of N-type semi-conductor material carried by said metal layer;
    (c) a second metal oxide layer of P-type semi-conductor material carried by said first metal oxide layer, wherein at least one of (a) said first metal oxide layer and (b) said second metal oxide layer includes an oxide of manganese;

(d) a layer of indium tin oxide carried by said second metal oxide layer;

(e) a layer of IRR glass carried by said indium tin oxide layer; and (f) means for applying an electrical potential to said metal layer and said indium tin oxide layer.

15. The lamp of claim 14 wherein said means includes a d.c. source of electric potential.

16. The lamp of claim 14 wherein said means includes an a.c. source of electric potential.

17. The lamp of claim 14 wherein said first metal oxide layer is approximately 3,000–5,000 Å in thickness and said second metal oxide layer is approximately 500–1000 Å in thickness.

18. The lamp of claim 14 wherein said metal layer is an alloy.

19. The lamp of claim 18 wherein said alloy includes manganese.

20. The lamp of claim 14 wherein said metal in said first metal oxide layer is selected from the group comprising aluminum, manganese, tantalum, titanium, thallium, tungsten, zirconium, and zinc.

21. An electroluminescing lamp comprising:

(a) a metal layer;

(b) at least one first metal oxide layer ofn N-type semi-conductor material carried by said metal layer;

(c) a second metal oxide layer of P-type semi-conductor material carried by said fist metal oxide layer, wherein at least one of (a) said first metal oxide layer and (b) said second metal oxide layer includes an oxide of manganese;

(d) a layer of indium tin oxide carried by said second metal oxide layer;

(e) a layer of IRR glass carried by said indium tin oxide layer; and (f) means for applying an electric potential to said metal layer and said indium tin oxide layer.

22. The lamp of claim 21 wherein said first metal oxide layer is approximately 3,000–5,000 Å in thickness and said second metal oxide layer is approximately 500–1000 Å in thickness.

23. The lamp of claim 21 wherein said first metal oxide layer includes at least one of the group consisting of aluminum oxide and manganese dioxide.

24. The lamp of claim 21 wherein said second metal oxide includes $Mn_2O_3$.

* * * * *